(12) United States Patent
Gu

(10) Patent No.: US 12,078,671 B2
(45) Date of Patent: Sep. 3, 2024

(54) METHOD AND APPARATUS OF TESTING CIRCUIT, AND STORAGE MEDIUM

(71) Applicant: CHANGXIN MEMORY TECHNOLOGIES, INC., Hefei (CN)

(72) Inventor: Cheng Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 189 days.

(21) Appl. No.: 17/808,138

(22) Filed: Jun. 22, 2022

(65) Prior Publication Data
US 2023/0221365 A1    Jul. 13, 2023

(30) Foreign Application Priority Data

Jan. 11, 2022  (CN) .......................... 202210025329.8

(51) Int. Cl.
*G01R 31/28* (2006.01)
*G01R 31/317* (2006.01)

(52) U.S. Cl.
CPC ... *G01R 31/2853* (2013.01); *G01R 31/31707* (2013.01); *G01R 31/31724* (2013.01)

(58) Field of Classification Search
CPC .............. G01R 31/2853; G01R 31/317; G01R 31/31724; G01R 31/31725
USPC ......................................................... 324/527
See application file for complete search history.

(56) References Cited

U.S. PATENT DOCUMENTS

| | | | | |
|---|---|---|---|---|
| 4,542,505 A | * | 9/1985 | Binoeder | G01R 31/31725 714/736 |
| 5,255,208 A | * | 10/1993 | Thakore | G01R 31/40 714/45 |
| 6,111,414 A | * | 8/2000 | Chatterjee | G01R 31/2853 324/633 |
| 6,331,770 B1 | * | 12/2001 | Sugamori | G01R 31/31905 714/724 |
| 2021/0156914 A1 | * | 5/2021 | Ning | G01R 31/318558 |

FOREIGN PATENT DOCUMENTS

CN          106874177 A       6/2017

* cited by examiner

*Primary Examiner* — Christopher P McAndrew
(74) *Attorney, Agent, or Firm* — Kilpatrick Townsend & Stockton LLP

(57) ABSTRACT

The present disclosure provides a method and an apparatus of testing a circuit, and a storage medium. The method of testing a circuit includes: determining a preset circuit module in a to-be-tested circuit and a preset node in the preset circuit module; inputting a test signal to an input terminal of the to-be-tested circuit according to a preset input rule, and obtaining a signal of the preset node in the preset circuit module; and determining a status of the preset circuit module based on the obtained signal of the preset node.

16 Claims, 4 Drawing Sheets

METHOD AND APPARATUS OF TESTING CIRCUIT, AND STORAGE MEDIUM

CROSS-REFERENCE TO RELATED APPLICATIONS

This application claims the priority of Chinese Patent Application No. 202210025329.8, submitted to the Chinese Intellectual Property Office on Jan. 11, 2022, the disclosure of which is incorporated herein in its entirety by reference.

TECHNICAL FIELD

The present disclosure relates to the technical field of semiconductors, and in particular, to a method and an apparatus of testing a circuit, and a storage medium.

BACKGROUND

With the development of chip technologies, a circuit design of a chip is becoming more complex. In a circuit design process, there may be circuit design defects. In the related art, the circuit design defects are determined by testing and verifying a function and a timing of a circuit.

SUMMARY

An overview of the subject matter detailed in the present disclosure is provided below, which is not intended to limit the protection scope of the claims.

The present disclosure provides a method and an apparatus of testing a circuit, and a storage medium.

According to a first aspect of embodiments of the present disclosure, a method of testing a circuit is provided, including:

determining a preset circuit module in a to-be-tested circuit and a preset node in the preset circuit module;

inputting a test signal to an input terminal of the to-be-tested circuit according to a preset input rule, and obtaining a signal of the preset node in the preset circuit module; and determining a status of the preset circuit module based on the obtained signal of the preset node.

A second aspect of the present disclosure provides an apparatus of testing a circuit, including:

a processor; and a memory, configured to store an instruction executable by the processor, wherein the processor is configured to execute:

determining a preset circuit module in a to-be-tested circuit and a preset node in the preset circuit module;

inputting a test signal to an input terminal of the to-be-tested circuit according to a preset input rule, and obtaining a signal of the preset node in the preset circuit module; and determining a status of the preset circuit module based on the obtained signal of the preset node.

According to a third aspect of the embodiments of the present disclosure, a non-transitory computer-readable storage medium is provided, wherein when executed by a processor of an apparatus of testing a circuit, an instruction in the non-transitory computer-readable storage medium enables the apparatus of testing a circuit to execute the method of testing a circuit provided in the exemplary embodiments of the present disclosure.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the related art, testing and verification of a circuit design of a chip focus on function verification and timing verification, but this verification method makes it difficult to determine a conflict point in a circuit. The present disclosure provides a method of testing a circuit, which takes a corresponding functional module of a circuit as a detection object for detection and verification, so as to accurately determine a conflict existing in a circuit design. Defects in the circuit design can be found in a test stage after the design is completed, by testing and verifying the circuit that is completely designed, or found in a circuit design stage by testing and verifying circuit modules that realize different functions. If some design defects are not found in the design stage, it may be impossible to analyze and determine relevant defects based on simple test phenomena in the test stage after the design is completed. For example, in a related circuit of the chip, because a conflict often occurs on a latch and/or a flip-flop, it is difficult to determine a conflict point causing the conflict or a high resistance point in the test stage if they are not found in the design stage.

Figure 1:
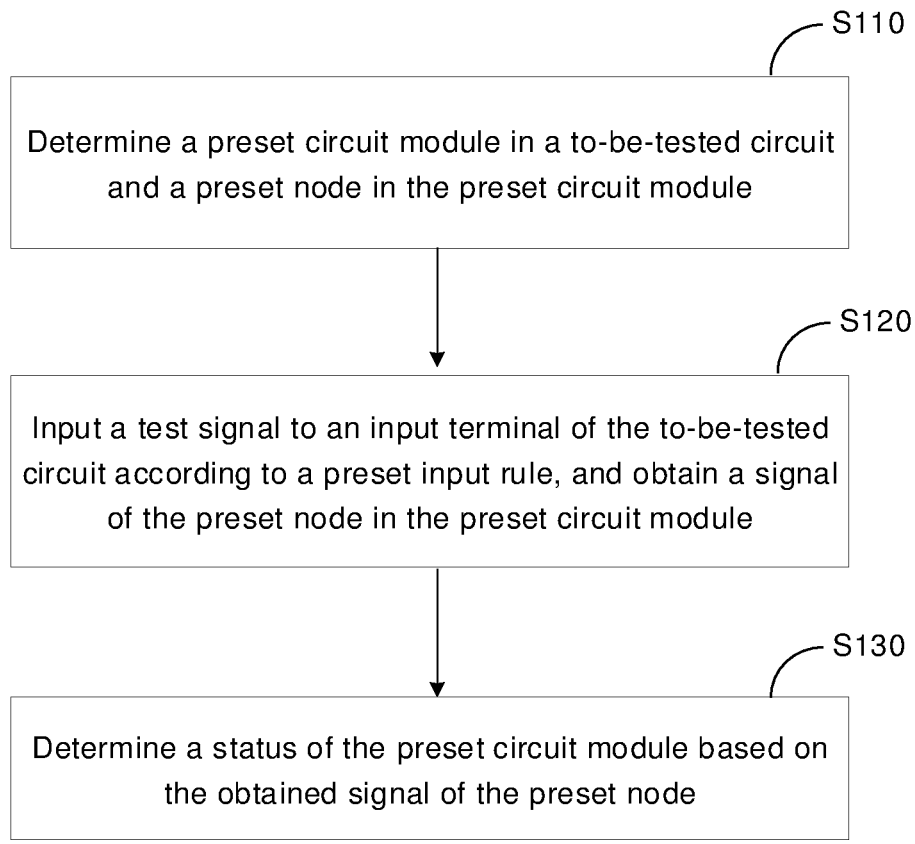
FIG. 1 is a flowchart of a method of testing a circuit according to an exemplary embodiment.

To resolve the above problems, the present disclosure provides a method of testing a circuit, which takes a corresponding functional module (application scenario) of a circuit as a detection object for detection and verification, so as to accurately determine a conflict existing in a circuit design. For the method of testing a circuit, reference may be made to FIG. 1. FIG. 1 shows a method of testing a circuit according to an exemplary embodiment. The method of testing a circuit includes the following steps:

S110: Determine a preset circuit module in a to-be-tested circuit and a preset node in the preset circuit module.

S120: Input a test signal to an input terminal of the to-be-tested circuit according to a preset input rule, and obtain a signal of the preset node in the preset circuit module.

S130: Determine a status of the preset circuit module based on the obtained signal of the preset node.

In the method of testing a circuit provided in the exemplary embodiment of the present disclosure, the preset circuit module in the to-be-tested circuit and the preset node in the preset circuit module are determined; the test signal is input to the input terminal of the to-be-tested circuit according to the preset input rule, and the signal of the preset node in the preset circuit module is obtained; and the status of the preset circuit module is determined based on the obtained signal of the preset node. The method of testing a circuit provided in the exemplary embodiment of the present disclosure takes the preset circuit module as a test object, and determines the status of the preset circuit module based on the signal of the preset node in the preset circuit module. In this way, a circuit can be tested in initial, middle and later stages of a circuit design based on a corresponding functional module of the circuit and the circuit is not limited to being tested after the circuit design is completed, and a defect and a conflict in the circuit design can be found in time.

The preset node includes one or more of an input terminal, an output terminal, or an intermediate node of the preset circuit module; and the intermediate node includes a node describing a signal change between the input terminal and the output terminal of the preset circuit module.

Figure 2:
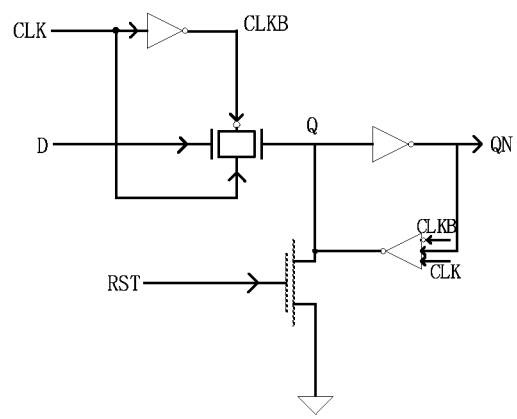
FIG. 2 is a schematic circuit diagram of a flip-flop according to an exemplary embodiment.

The preset circuit module and the preset node in the preset circuit module can also be determined in any feasible manner, for example, by determining, according to a connection relationship of preset circuit modules in the to-be-tested circuit, each of the preset circuit modules in the to-be-tested circuit and all preset nodes of each of the preset circuit modules. Before the to-be-tested circuit is tested, input and output terminals of each of the preset circuit modules are recorded. The input terminal may include a port for inputting a signal in any manner, such as a data signal input terminal or a control signal input terminal. The output terminal may include a port for outputting a signal in any manner, such as a data signal output terminal or a control signal output terminal. The intermediate node is determined based on a functional characteristic of the preset circuit module. The intermediate node is configured to describe the signal change between the input terminal and the output terminal of the preset circuit module. As shown in FIG. 2, FIG. 2 is a schematic diagram of the preset circuit module according to the exemplary embodiment of the present disclosure. The preset circuit module is a flip-flop. FIG. 2 illustrates a circuit diagram of the flip-flop. The preset node includes an input terminal D and an output terminal QN of the flip-flop, and the intermediate node includes a node Q describing a signal change between the input terminal D and the output terminal QN in a flip-flop circuit. FIG. 2 further includes a control signal terminal CLK. In order to facilitate statistics and description, the control signal terminal CLK can also be described as the input terminal. The preset circuit module in the to-be-tested circuit and the corresponding preset node in the preset circuit module can also be recorded in any manner convenient for verification and comparison in a test process. For example, the preset circuit module in the to-be-tested circuit and the corresponding preset node in the preset circuit module may be recorded in a form of a table.

The preset node may include one or more of the input terminal, the output terminal, or the intermediate node, which is not specifically limited herein to ensure that a to-be-tested node in the to-be-tested circuit is detected, so as to further test whether the circuit is abnormal. In the method of testing a circuit provided in the exemplary embodiment of the present disclosure, the preset circuit module in the to-be-tested circuit can be determined based on a functional module. For example, the flip-flop and/or a latch in the to-be-tested circuit are/is tested as functional modules/a functional module. That is, the preset circuit module is the flip-flop and/or the latch to ensure that the preset circuit module can be tested in any stage of the circuit design, such as the initial stage of the circuit design. After the flip-flop and/or the latch in the to-be-tested circuit and their corresponding input terminals, output terminals, and intermediate nodes are determined, a plurality of test signals are input to the input terminal of the to-be-tested circuit according to a preset sequence, signals of the corresponding input terminals, output terminals, and intermediate nodes of the flip-flop and/or the latch are determined, and whether there is a design defect in the flip-flop and/or the latch is determined based on the corresponding signals.

The flip-flop shown in FIG. 2 is used as an example. If the control signal terminal CLK is 1, a node CLKB is inverted to 0, the input terminal D is 1, and a reset terminal RST is 0. Because the input terminal D is 1, the intermediate node Q is pulled to 1. However, because a signal is be pulled to 0 at the reset terminal RST, the intermediate node Q needs to be pulled to 1 and 0 at the same time, resulting in a conflict on the intermediate node Q. Then a conflict point in the flip-flop of the to-be-tested circuit is determined. In other exemplary embodiments of the present disclosure, if the input terminal D is not wired and is in a floating state, the control signal terminal CLK is 1. When the node CLKB is inverted to 0 and the reset terminal RST is 1, a signal of the intermediate node Q theoretically changes with the signal of the input terminal D. However, due to a design defect, if the input terminal D is not wired, the intermediate node Q is also in the floating state, causing a high resistance state, and then a point in the high resistance state in the flip-flop of the to-be-tested circuit is determined. In the exemplary embodiments, it is determined based on the intermediate node Q that the flip-flop is in a conflict state or the high resistance state.

The signal of the intermediate node Q is not a truth value such as 1 or 0 in both the conflict state and the high resistance state. Therefore, when the obtained signal of the preset node is not the truth value, it can be determined that the preset circuit module is abnormal. For example, when the obtained signal of the intermediate node Q of the flip-flop is not the truth value, the flip-flop is determined as abnormal.

In an exemplary embodiment of the present disclosure, when the to-be-tested circuit includes a plurality of preset circuit modules, path information of the preset circuit modules in the to-be-tested circuit can be recorded, such that positions of the preset circuit modules can be determined in time in the circuit test process. In the process of testing the to-be-tested circuit, when a preset circuit module is abnormal, its position can be determined based on recorded path information of the preset circuit module, and a cause for the abnormality of the preset circuit module can be determined in time based on a functional characteristic of the to-be-tested circuit.

Figure 3:
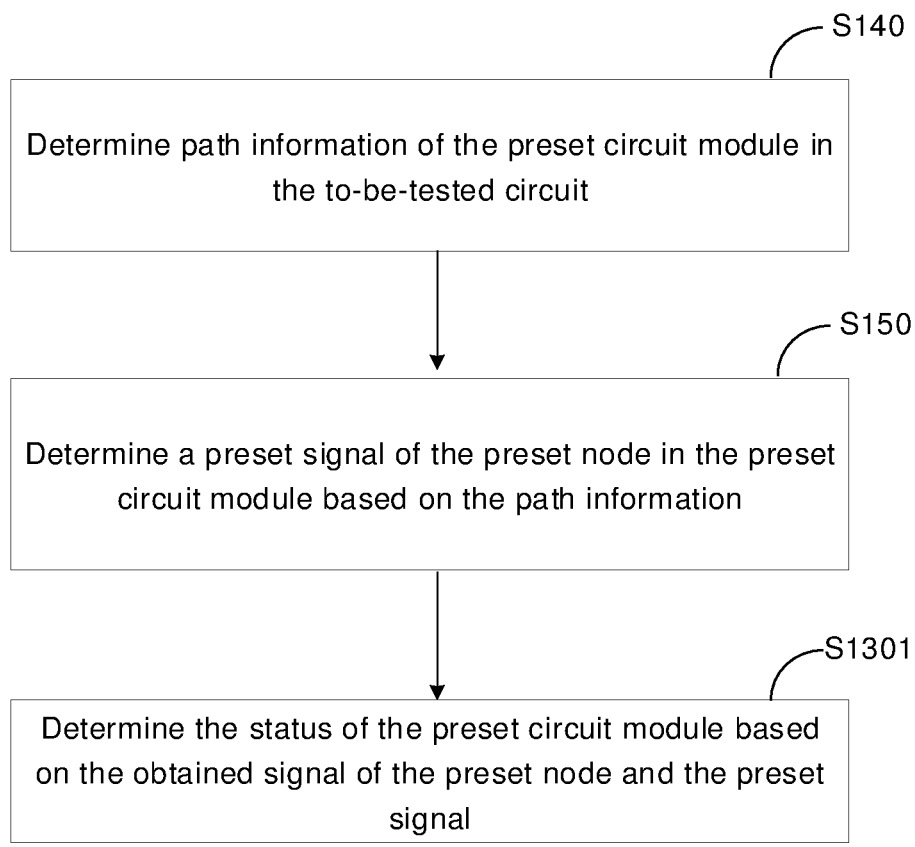
FIG. 3 is a flowchart of a method of testing a circuit according to an exemplary embodiment.

In another exemplary embodiment of the present disclosure, a preset signal of the preset node in the preset circuit module can also be determined based on path information of the preset circuit module in the to-be-tested circuit, such that the status of the preset circuit module can be determined by comparing the preset signal and the actually measured signal of the preset node in the preset circuit module. As shown in FIG. 3, FIG. 3 shows a method of testing a circuit according to an exemplary embodiment. The method of testing a circuit further includes the following steps:

S140: Determine the path information of the preset circuit module in the to-be-tested circuit.

S150: Determine the preset signal of the preset node in the preset circuit module based on the path information.

S1301: Determine the status of the preset circuit module based on the obtained signal of the preset node and the preset signal.

In the exemplary embodiment of the present disclosure, it is necessary to determine information of a position of the preset circuit module in the to-be-tested circuit, namely, the path information of the preset circuit module in the to-be-tested circuit, so as to determine the preset signal of the preset circuit module based on a flow status of the test signal of the to-be-tested circuit. That is, based on the path information of the preset circuit module in the to-be-tested circuit and the test signal of the input terminal of the to-be-tested circuit, preset signals of the input terminal, the output terminal, and the intermediate node of the preset circuit module are determined. The preset signals of the input terminal, the output terminal, and the intermediate node of the preset circuit module may be different based on different test signals of the input terminal of the to-be-tested circuit. When different test signals are input to the input terminal of the to-be-tested circuit, the preset node in the preset circuit module corresponds to different preset signals.

In the test process, when the test signal is input to the input terminal of the to-be-tested circuit, the preset signals corresponding to the input terminal, the output terminal, and the intermediate node of the preset circuit module are determined, to compare the preset signals and the actually obtained signal of the preset node in the preset circuit module in the test process to determine the status of the preset circuit module.

Figure 4:
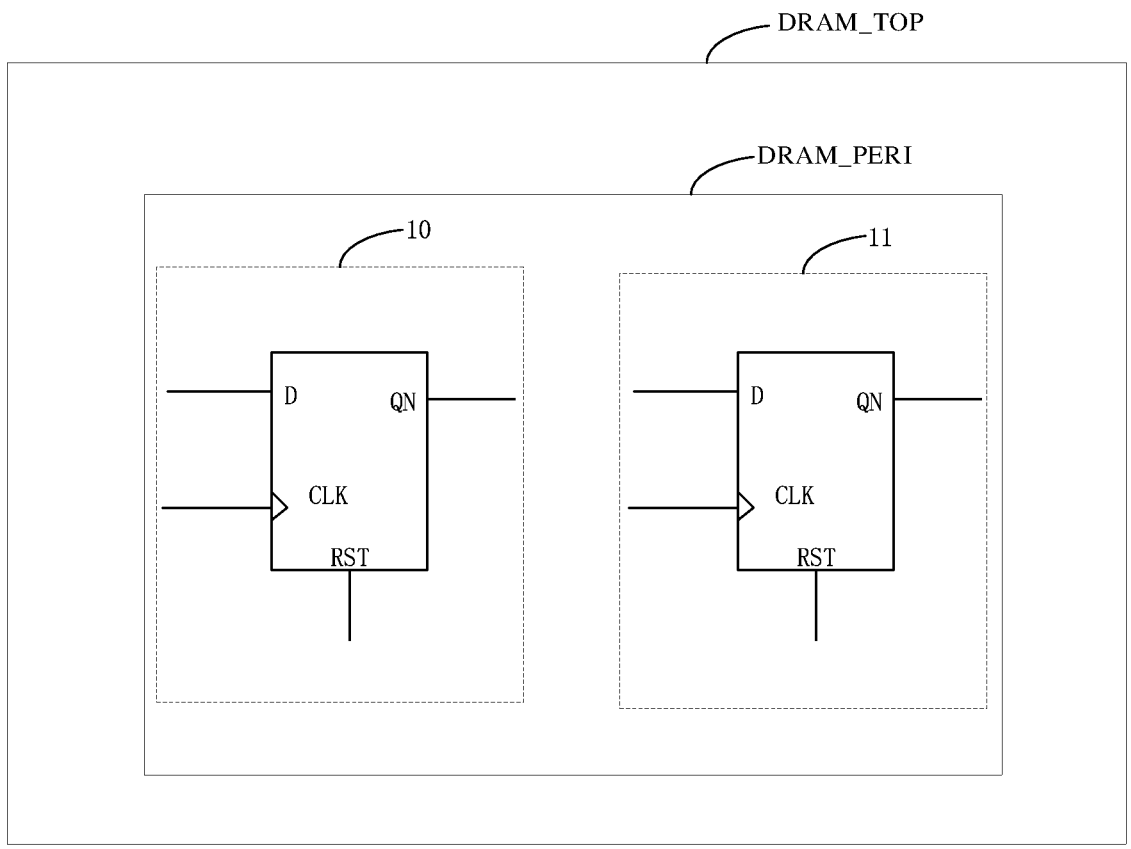
FIG. 4 is a schematic diagram of a preset circuit module in a to-be-tested circuit according to an exemplary embodiment.

The path information of the preset circuit module in the to-be-tested circuit may be recorded in any manner. The path information may be recorded by taking the preset circuit module as a minimum unit, or by taking the preset node in the preset circuit module as a minimum unit. As shown in FIG. 4, FIG. 4 is a schematic diagram of the preset circuit module in the to-be-tested circuit. In FIG. 4, a to-be-tested circuit DRAM_TOP includes a DRAM_PERI circuit, and the DRAM_PERI circuit includes a first flip-flop 10 and a second flip-flop 11. The first flip-flop 10 and the second flip-flop 11 are used as preset circuit modules, and path information of the preset circuit modules is recorded. If a preset node in each of the preset circuit modules is used as the minimum unit for recording, the path information of the preset circuit modules, namely, the first flip-flop 10 and the second flip-flop 11, is recorded as follows:

first flip-flop 10: DRAM_TOP/DRAM_PERI/I0; and second flip-flop 11: DRAM_TOP/DRAM_PERI/I1.

If a preset node in each of the preset circuit modules is used as the minimum unit for recording, the path information of the preset circuit modules, namely, the first flip-flop 10 and the second flip-flop 11, is recorded as follows:

first flip-flop 10: DRAM_TOP/DRAM_PERI/I0/D; DRAM_TOP/DRAM_PERI/I0/CLK; DRAM_TOP/DRAM_PERI/I0/RST; DRAM_TOP/DRAM_PERI/I0/QN; DRAM_TOP/DRAM_PERI/I0/Q; and second flip-flop 11: DRAM_TOP/DRAM_PERI/I1/D; DRAM_TOP/DRAM_PERI/I1/CLK; DRAM_TOP/DRAM_PERI/I1/RST; DRAM_TOP/DRAM_PERI/I1/QN; DRAM_TOP/DRAM_PERI/I1/Q.

A correspondence between the test signal input to the input terminal of the to-be-tested circuit and the preset signals corresponding to the input terminal, the output terminal, and the intermediate node of the preset circuit module may be recorded in any manner, for example, may be recorded in a form of a table. In this way, in the test process, the correspondence between the test signal input to the input terminal of the to-be-tested circuit and the preset signals corresponding to the input terminal, the output terminal, and the intermediate node of the preset circuit module can be obtained in time, so as to determine the status of the preset circuit module.

In the exemplary embodiment of the present disclosure, the path information of the preset circuit module in the to-be-tested circuit is recorded, such that the position of the preset circuit module in the to-be-tested circuit can be determined in time, and the preset signal of the preset node in the preset circuit module can also be determined based on the position of the preset circuit module in the to-be-tested circuit. In this way, in the test process, the status of the preset circuit module is accurately determined by comparing the actually obtained signal of the preset node in the preset circuit module and the corresponding preset signal.

During a circuit design, many different functional modules are involved. A more complex circuit design makes more functional modules involved. If an overall function and timing of a circuit are tested and verified after the circuit design is completed, it is difficult to determine a conflict point in the circuit. If each functional module involved in the circuit design, namely, the preset circuit module, can be used as a detection object, the circuit can be tested in any stage of the circuit design. For example, a relevant functional module that has been designed can be tested in an initial stage of the circuit design to determine a problem existing in the initial stage of the circuit design, or a relevant functional module that has been designed can be tested in middle and later stages of the circuit design to determine a problem existing in the middle and later stages of the circuit design.

The test signal may be input according to a preset sequence in both the initial stage and the middle and later stages of the circuit design. In the exemplary embodiment of the present disclosure, the inputting a test signal to an input terminal of the to-be-tested circuit according to a preset input rule includes:

inputting a plurality of test signals to the input terminal of the to-be-tested circuit successively according to a preset sequence.

In the exemplary embodiment of the present disclosure, the plurality of test signals are input to the input terminal of the to-be-tested circuit successively in the preset sequence, such that statuses of different preset nodes of the preset circuit module in the to-be-tested circuit can be visually detected, so as to determine the status of the preset circuit module. The preset sequence may be determined based on different functional requirements of preset functional modules.

The test signal may be input in a random manner in both the initial stage and the middle and later stages of the circuit design. In the exemplary embodiment of the present disclosure, the inputting a test signal to an input terminal of the to-be-tested circuit according to a preset input rule includes:

inputting a plurality of test signals to the input terminal of the to-be-tested circuit successively in a random manner.

In the exemplary embodiment of the present disclosure, the plurality of test signals are input to the input terminal of the to-be-tested circuit in the random manner, such that a stable state of the preset circuit module in the to-be-tested circuit can be detected.

The status of the preset circuit module in the to-be-tested circuit can be obtained in time no matter whether the test signals are input in the preset sequence or in the random manner, so as to determine whether the preset circuit module is abnormal.

In the exemplary embodiment of the present disclosure, the method of testing a circuit can be applied to a first stage of a design process of a target circuit, for example, in an initial design stage of the target circuit, and the test circuit includes a part of the target circuit. In the initial design stage of the target circuit, the target circuit is not completely designed, including the test circuit with a corresponding function. The test circuit includes the preset circuit module, and the preset circuit module may include a flip-flop and\or a register. The flip-flop and\or the register in the test circuit are/is used as test objects/a test object, and the test signal is input to an input terminal of the test circuit to test whether there is a circuit design problem in the flip-flop and\or the register.

In the initial design stage of the target circuit, the to-be-tested circuit may be tested according to a preset sequence and/or in a random manner based on a characteristic of the preset circuit module. Specifically, the to-be-tested circuit may be tested in the preset sequence, in the random manner, or in both the preset sequence and the random manner. For example, the to-be-tested circuit can be tested in the preset sequence first and then in the random manner, and vice versa. For example, in the initial circuit design stage, the target circuit is not completely designed. Therefore, the to-be-tested circuit may be tested only in the preset sequence, in other words, the plurality of test signals are input to the input terminal of the to-be-tested circuit in the preset sequence to obtain a signal of a preset node in the flip-flop and/or a signal of a preset node in the register, so as to quickly determine whether there is the circuit design problem in the flip-flop and/or the register in the to-be-tested circuit. If the circuit design problem is found in this stage, a circuit design defect can be corrected in time, so as to make a subsequent circuit design smoother and improve circuit design efficiency.

The method of testing a circuit may alternatively be applied to a second stage of a design process of a target circuit, for example, in middle and later design stages of the target circuit, and the test circuit may include a part of the target circuit or all of the target circuit. In the middle and later design stages of the target circuit, the circuit design is to be completed, and a circuit module of each part has a corresponding function. The test circuit includes the preset circuit module, and the preset circuit module may include a flip-flop and\or a register. The flip-flop and\or the register in the test circuit are/is used as test objects/a test object, and the test signal is input to an input terminal of the test circuit to test whether there is a circuit design problem in the flip-flop and\or the register.

In the middle and later design stages of the target circuit, the to-be-tested circuit may be tested according to a preset sequence or in a random manner based on a characteristic of the preset circuit module. Specifically, the to-be-tested circuit may be tested in the preset sequence, in the random manner, or in both the preset sequence and the random manner. For example, the to-be-tested circuit is tested in the preset sequence first and then in the random manner, and vice versa. For example, in the middle and later design stages of the target circuit, the flip-flop and/or the register in the to-be-tested circuit have/has been tested in an initial circuit design stage, and have/has a basic functional status. To make a function of the to-be-tested circuit more stable, the to-be-tested circuit may be tested only in the random manner, in other words, the plurality of test signals are input to the input terminal of the to-be-tested circuit in the random manner to obtain a signal of a preset node in the flip-flop and/or a signal of a preset node in the register, so as to quickly determine whether there is the circuit design problem in the flip-flop and/or the register in the to-be-tested circuit. In the method of testing a circuit provided in the present disclosure, although a test is carried out in the middle and later stages of the circuit design, the test is based on the preset circuit module. When the to-be-tested circuit is tested, the path information of each preset circuit module, namely, the flip-flop and/or the register, is recorded. In the test process, if an abnormality is found, an abnormal flip-flop and/or an abnormal register can be locked in time to determine a cause for the abnormality in time.

In the exemplary embodiment of the present disclosure, the method of testing a circuit may alternatively be applied to a design completion stage of a target circuit. In the design completion stage of the target circuit, the target circuit has a complete function, and the test circuit may be determined based on a functional characteristic of the target circuit. For example, the test circuit may include a part of the target circuit or all of the target circuit. The test circuit includes the preset circuit module, and the preset circuit module may include a flip-flop and\or a register. The flip-flop and\or the register in the test circuit are/is used as test objects/a test object, and the test signal is input to an input terminal of the test circuit to test whether there is a circuit design problem in the flip-flop and\or the register.

In the design completion stage of the target circuit, the to-be-tested circuit may be tested according to a preset sequence or in a random manner. Specifically, the to-be-tested circuit may be tested in the preset sequence, in the random manner, or in both the preset sequence and the random manner. For example, the to-be-tested circuit is tested in the preset sequence first and then in the random manner, and vice versa. For example, in the design completion stage of the target circuit, to test the circuit more sufficiently, the plurality of test signals can be input to the input terminal of the to-be-tested circuit in the preset sequence, to obtain a signal of a preset node in the flip-flop and\or a signal of a preset node in the register, and determine whether the flip-flop and\or the register are/is abnormal. If the flip-flop and\or the register operate/operates normally, the plurality of test signals are input to the input terminal of the to-be-tested circuit in the random manner to further determine whether the flip-flop and\or the register operate/operates normally, so as to improve circuit test accuracy.

Figure 5:
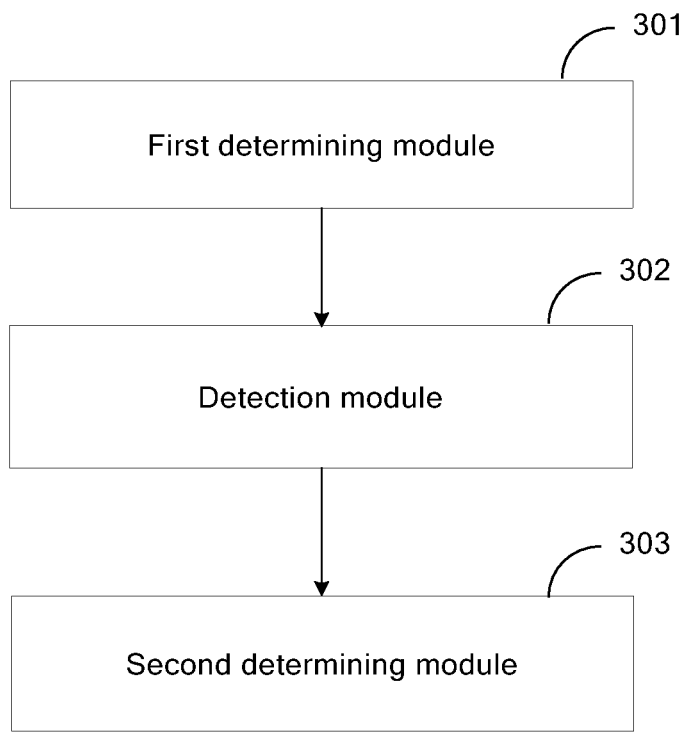
FIG. 5 is a block diagram showing an apparatus of testing a circuit according to an exemplary embodiment.

FIG. 5 is a block diagram showing an apparatus of testing a circuit according to an exemplary embodiment. As shown in FIG. 5, the apparatus of testing a circuit includes at least a first determining module 301, a detection module 302, and a second determining module 303.

The first determining module 301 is configured to determine a preset circuit module in a to-be-tested circuit and a preset node in the preset circuit module.

The detection module 302 is configured to input a test signal to an input terminal of the to-be-tested circuit according to a preset input rule, and obtain a signal of the preset node in the preset circuit module.

The second determining module 303 is configured to determine a status of the preset circuit module based on the obtained signal of the preset node.

Figure 6:
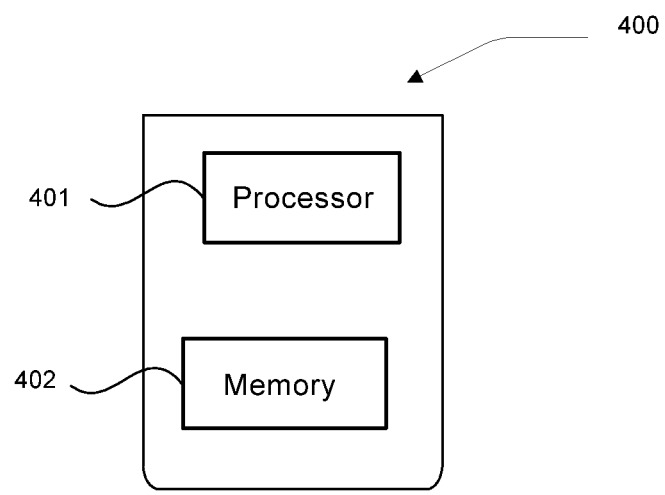
FIG. 6 is a block diagram showing an apparatus of testing a circuit according to another exemplary embodiment.

FIG. 6 is a block diagram showing an apparatus of testing a circuit, namely, an apparatus of testing a circuit 400, according to another exemplary embodiment. For example, the apparatus of testing a circuit 400 can be provided as a terminal device. Referring to FIG. 6, the apparatus of testing a circuit 400 includes a processor 401, and one or more processors may be set as required. The apparatus of testing a circuit 400 further includes a memory 402, configured to store an instruction executable by the processor 401, such as an application program. One or more memories may be set as required. The memory may store one or more application programs. The processor 401 is configured to execute the instruction to execute the above method for determining a preset circuit module in a to-be-tested circuit and a preset node in the preset circuit module; inputting a test signal to an input terminal of the to-be-tested circuit according to a preset input rule, and obtaining a signal of the preset node in the preset circuit module; and determining a status of the preset circuit module based on the obtained signal of the preset node.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media that include computer-usable program code. The computer storage media include volatile, non-volatile, removable, and non-removable media implemented in any method or technology for storing information (such as computer-readable instructions, data structures, program modules, or other data), including but not limited to, a random access memory (RAM), a read-only memory (ROM), an electrically erasable programmable read-only memory (EEPROM), a flash memory or other storage technologies, a compact disc read-only memory (CD-ROM), a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons skilled in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including an instruction is provided, for example, the memory 402 including the instruction, and the instruction may be executed by the processor 401 of the apparatus of testing a circuit 400 to accomplish the method described above. For example, the non-transitory computer-readable storage medium may be a ROM, a RAM, a CD-ROM, a magnetic tape, a floppy disk, an optical data storage device, or the like.

A non-transitory computer-readable storage medium is provided. When executed by a processor of an apparatus of testing a circuit, an instruction in the non-transitory computer-readable storage medium enables the apparatus of testing a circuit to perform the following steps:

determining a preset circuit module in a to-be-tested circuit and a preset node in the preset circuit module;

inputting a test signal to an input terminal of the to-be-tested circuit to a preset input rule, and obtaining a signal of the preset node in the preset circuit module; and determining a status of the preset circuit module based on the obtained signal of the preset node.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In the specification, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

The invention claimed is:

1. A method of testing a circuit, comprising:
   determining a preset circuit module in a to-be-tested circuit and a preset node in the preset circuit module;
   inputting a test signal to an input terminal of the to-be-tested circuit according to a preset input rule, and obtaining a signal of the preset node in the preset circuit module; and
   determining a status of the preset circuit module based on the obtained signal of the preset node; and,
   wherein the inputting a test signal to an input terminal of the to-be-tested circuit according to a preset input rule comprises:
   inputting a plurality of test signals to the input terminal of the to-be-tested circuit successively according to a preset sequence; and
   the method of testing a circuit applied to a first stage of a design process of a target circuit, wherein the to-be-tested circuit comprises a part of the target circuit;
   the method of testing a circuit applied to a second stage of a design process of a target circuit, wherein the to-be-tested circuit comprises a part of the target circuit or all of the target circuit; or
   the method of testing a circuit applied to a design completion stage of a target circuit, wherein the to-be-tested circuit comprises a part of the target circuit or all of the target circuit.

2. The method of testing a circuit according to claim 1, wherein the preset node comprises one or more of an input terminal, an output terminal, or an intermediate node of the preset circuit module; and the intermediate node comprises a node describing a signal change between the input terminal and the output terminal of the preset circuit module.

3. The method of testing a circuit according to claim 2, further comprising:
   determining path information of the preset circuit module in the to-be-tested circuit.

4. The method of testing a circuit according to claim 3, further comprising:
   determining a preset signal of the preset node in the preset circuit module based on the path information; and
   the determining a status of the preset circuit module based on the obtained signal of the preset node comprising:
   determining the status of the preset circuit module by comparing the preset signal of the preset node and the obtained signal of the preset node in the preset circuit module in the test process.

5. The method of testing a circuit according to claim 2, wherein the preset circuit module comprises a latch and/or a flip-flop.

6. The method of testing a circuit according to claim 1, wherein the determining a preset circuit module in a to-be-tested circuit and a preset node in the preset circuit module comprises:
   determining, according to a connection relationship of preset circuit modules in the to-be-tested circuit, each of the preset circuit modules in the to-be-tested circuit and all preset nodes in the each of the preset circuit modules.

7. The method of testing a circuit according to claim 1, wherein the determining a status of the preset circuit module based on the obtained signal of the preset node comprises:
   when the obtained signal of the preset node is not a truth value, determining the preset circuit module as abnormal.

8. An apparatus of testing a circuit, comprising:
   a processor; and
   a memory, configured to store an instruction executable by the processor, wherein
   the processor is configured to execute the method of testing a circuit according to claim 1.

9. A non-transitory computer-readable storage medium, wherein when executed by a processor of an apparatus of testing a circuit, an instruction in the non-transitory computer-readable storage medium enables the apparatus of testing a circuit to execute the method of testing a circuit according to claim 1.

10. A method of testing a circuit, comprising:
    determining a preset circuit module in a to-be-tested circuit and a preset node in the preset circuit module;
    inputting a test signal to an input terminal of the to-be-tested circuit according to a preset input rule, and obtaining a signal of the preset node in the preset circuit module; and
    determining a status of the preset circuit module based on the obtained signal of the preset node;
    wherein the inputting a test signal to an input terminal of the to-be-tested circuit according to a preset input rule comprises:
    inputting a plurality of test signals to the input terminal of the to-be-tested circuit successively in a random manner;
    the method of testing a circuit applied to a first stage of a design process of a target circuit, wherein the to-be-tested circuit comprises a part of the target circuit; or
    the method of testing a circuit applied to a second stage of a design process of a target circuit, wherein the to-be-tested circuit comprises a part of the target circuit or all of the target circuit; or
    the method of testing a circuit applied to a design completion stage of a target circuit, wherein the to-be-tested circuit comprises a part of the target circuit or all of the target circuit.

11. The method of testing a circuit according to claim 10, wherein the preset node comprises one or more of an input terminal, an output terminal, or an intermediate node of the preset circuit module; and the intermediate node comprises a node describing a signal change between the input terminal and the output terminal of the preset circuit module.

12. The method of testing a circuit according to claim 11, further comprising:
    determining path information of the preset circuit module in the to-be-tested circuit.

13. The method of testing a circuit according to claim 12, further comprising:
    determining a preset signal of the preset node in the preset circuit module based on the path information; and
    the determining a status of the preset circuit module based on the obtained signal of the preset node comprising:
    determining the status of the preset circuit module based on the obtained signal of the preset node and the preset signal.

14. The method of testing a circuit according to claim 11, wherein the preset circuit module comprises a latch and/or a flip-flop.

15. The method of testing a circuit according to claim 10, wherein the determining a preset circuit module in a to-be-tested circuit and a preset node in the preset circuit module comprises:
 determining, according to a connection relationship of preset circuit modules in the to-be-tested circuit, each of the preset circuit modules in the to-be-tested circuit and all preset nodes in the each of the preset circuit modules.

16. The method of testing a circuit according to claim 10, wherein the determining a status of the preset circuit module based on the obtained signal of the preset node comprises:
 when the obtained signal of the preset node is not a truth value, determining the preset circuit module as abnormal.

* * * * *